(12) United States Patent
May

(10) Patent No.: US 7,139,330 B1
(45) Date of Patent: Nov. 21, 2006

(54) SYSTEM FOR SIGNAL MIXING AND METHOD THEREOF

(75) Inventor: Michael R. May, Austin, TX (US)

(73) Assignee: VIXS Systems, Inc., Toronto (CA)

( * ) Notice: Subject to any disclaimer, the term of this patent is extended or adjusted under 35 U.S.C. 154(b) by 184 days.

(21) Appl. No.: 09/999,540

(22) Filed: Oct. 31, 2001

(51) Int. Cl.
  H04L 27/06 (2006.01)
(52) U.S. Cl. ............................. 375/316; 375/340
(58) Field of Classification Search ........... 375/261, 375/275, 295, 298, 316, 353, 354, 362, 340; 340/573; 343/741
See application file for complete search history.

(56) References Cited

U.S. PATENT DOCUMENTS

| | | | |
|---|---|---|---|
| 4,866,395 A | 9/1989 | Hostetter | |
| 5,027,203 A | 6/1991 | Samad et al. | |
| 5,093,847 A | 3/1992 | Cheng | |
| 5,115,812 A | 5/1992 | Sano et al. | |
| 5,253,056 A | 10/1993 | Puri | |
| 5,475,434 A | 12/1995 | Kim | |
| 5,563,950 A | 10/1996 | Easter et al. | |
| 5,602,589 A | 2/1997 | Vishwanath et al. | |
| 5,635,985 A | 6/1997 | Boyce et al. | |
| 5,644,361 A | 7/1997 | Ran et al. | |
| 5,652,749 A | 7/1997 | Davenport et al. | |
| 5,732,391 A | 3/1998 | Fiocca | |
| 5,737,020 A | 4/1998 | Hall et al. | |
| 5,740,028 A | 4/1998 | Sugiyama et al. | |
| 5,844,545 A | 12/1998 | Suzuki et al. | |
| 5,850,443 A | 12/1998 | Van Oorschot et al. | |
| 5,940,130 A | 8/1999 | Nilsson et al. | |
| 5,973,601 A * | 10/1999 | Campana, Jr. ............ | 340/573.4 |
| 5,996,029 A | 11/1999 | Sugiyama et al. | |
| 6,005,623 A | 12/1999 | Takahashi et al. | |
| 6,005,624 A | 12/1999 | Vainsencher | |
| 6,014,694 A | 1/2000 | Aharoni et al. | |
| 6,040,863 A | 3/2000 | Kato | |
| 6,081,295 A | 6/2000 | Adolph et al. | |
| 6,141,693 A | 10/2000 | Perlman et al. | |
| 6,144,402 A | 11/2000 | Norsworthy et al. | |
| 6,167,084 A | 12/2000 | Wang et al. | |
| 6,182,203 B1 | 1/2001 | Simar, Jr. et al. | |
| 6,215,821 B1 | 4/2001 | Chen | |
| 6,219,358 B1 | 4/2001 | Pinder et al. | |
| 6,222,886 B1 | 4/2001 | Yogeshwar | |
| 6,236,683 B1 | 5/2001 | Mougeat et al. | |
| 6,259,741 B1 | 7/2001 | Chen et al. | |

(Continued)

FOREIGN PATENT DOCUMENTS

EP    0661826 A2    7/1995

(Continued)

OTHER PUBLICATIONS

Pedro Assuncao and Mohammad Ghanbari, "Rate Reduction Techniques for MPEG-2 Video Bit Streams," SPIE vol. 2952, Apr. 1996, 10 pp.

(Continued)

Primary Examiner—Robert Pascal
Assistant Examiner—Krista Flanagan

(57) ABSTRACT

A system and methods are provided for mixing input signal data values with values of a sinusoidal waveform. The sinusoidal waveform is normalized at a value greater than one and sampled to generate a fixed set of values for every period of the sinusoidal waveform. The fixed set of values is then converted to a plurality of bit-shift summation sets. The bit-shift summation sets are applied to the input signal by binary shifting the input signal data values. The binary shifts represent a mixing of the fixed set of values associated with the sinusoidal waveform and the input signal values.

23 Claims, 4 Drawing Sheets

U.S. PATENT DOCUMENTS

| | | | |
|---|---|---|---|
| 6,263,022 B1 | 7/2001 | Chen et al. | |
| 6,300,973 B1 | 10/2001 | Feder et al. | |
| 6,307,939 B1 | 10/2001 | Vigarie | |
| 6,314,138 B1 | 11/2001 | Lemaguet | |
| 6,323,904 B1 | 11/2001 | Knee | |
| 6,337,628 B1* | 1/2002 | Campana, Jr. | 340/573.4 |
| 6,366,614 B1 | 4/2002 | Pian et al. | |
| 6,385,248 B1 | 5/2002 | Pearlstein et al. | |
| 6,438,168 B1 | 8/2002 | Arye | |
| 6,480,541 B1 | 11/2002 | Girod et al. | |
| 6,526,099 B1 | 2/2003 | Christopoulos et al. | |
| 6,549,561 B1 | 4/2003 | Crawford | |
| 6,584,509 B1 | 6/2003 | Putzolu | |
| 6,714,202 B1 | 3/2004 | Dorrell | |
| 6,724,726 B1 | 4/2004 | Coudreuse | |
| 6,748,020 B1 | 6/2004 | Eifrig et al. | |
| 2001/0000959 A1* | 5/2001 | Campana, Jr. | 340/573.1 |
| 2001/0026591 A1 | 10/2001 | Keren et al. | |
| 2002/0106022 A1 | 8/2002 | Takahashi et al. | |
| 2002/0110193 A1 | 8/2002 | Kyoon et al. | |
| 2002/0138259 A1 | 9/2002 | Kawahara | |
| 2002/0145931 A1 | 10/2002 | Pitts | |
| 2002/0196851 A1 | 12/2002 | Arnaud | |
| 2003/0093661 A1 | 5/2003 | Loh et al. | |
| 2003/0152148 A1 | 8/2003 | Laksono | |

FOREIGN PATENT DOCUMENTS

| | | |
|---|---|---|
| EP | 0739138 A2 | 10/1996 |
| EP | 0805599 A2 | 11/1997 |
| EP | 0855805 A2 | 7/1998 |
| EP | 0896300 B1 | 2/1999 |
| EP | 0901285 A1 | 2/1999 |
| EP | 0955607 A2 | 11/1999 |
| EP | 1032214 A2 | 8/2000 |
| EP | 1087625 A2 | 3/2001 |
| JP | 07-210670 A | 8/1995 |
| WO | WO 01/95633 A2 | 12/2001 |
| WO | WO 02/080518 A2 | 10/2002 |

OTHER PUBLICATIONS

Jae-Young Pyun, "QoS Provisioning for Video Streaming over IEEE 802.11 Wireless LAN," (abridged) IEEE Conference in Consumer Electronics, Jun. 16, 2003, 3 pp. [online] Retrieved from the Internet Jul. 8, 2003 at URL.

Krisda Lengwehasatit and Antonio Ortega, "Computionally Scalable Partial Distance Based Fast Search Motion Estimation," Univ. of Southern California, 4 pp., date unknown.

Manoj Aggarwal and Ajai Narayan, "Efficient Huffman Decoding," 2000 IEEE, 0-7803-6297-7, pp. 936-939.

Peng Yin et al., "Video Transcoding by Reducing Spatial Resolution," Princeton University, Princeton, NJ, 4 pp., 2000.

Zhigang Fan and Ricardo de Queiroz, "Maximum Likelihood Estimation of JPEG Quantization Table in the Identification of Bitmap Compression History," Xerox Corporation, Webster, NY, 4 pp., date unknown.

Luis Ducla Soares et al., "Influence of Encoder Parameters on the Decoded Video Quality for MPEG-4 Over W-CDMA Mobile Networks," NTT DoCoMo, Inc. technical paper, 4 pp., date unknown.

Thomas Wiegand et al., "Long-Term Memory Motion-Compensated Prediction for Rubust Video Transmission," in Proc. ICIP2000, 4 pp.

P. Greg Sherwood et al., "Efficient Image and Channel Coding for Wireless Packet Networks," Univ. of CA, San Diego, CA, Dept. of ECE, 4 pp., date unknown.

Donghoon Yu et al.; "Fast Motion Estimation for Shape Coding in MPEG-4," 2003 IEEE Transactions on Circuits and Systems for Video Technology, vol. 13, No. 4, Apr. 2003, pp. 358-363.

Yu, Donghoom, et al., "Fast Motion Estimation for Shape Coding in MPEG-4," IEEE Transactions on Circuits and Systems for Video Technology, vol. 13, No. 4, 2003 IEEE, Apr. 2003, pp. 358-363.

Pyun, Jae-Young, "QoS Provisioning for Video Streaming Over IEEE 802.11 Wireless LAN," (abridged) IEEE Conferences in Consumer Electronics, Jun. 16, 2003, EE Times, Seoul, Korea, <http://eetimes.com/printableArticle?doc_id=OEG20030061S0070> retrieved Jul. 8, 2003.

Youn, Jeongnam et al., "Video Transcoding For Multiple Clients," Proceedings of the SPIE, Bellingham, VA. vol. 4067, XP008012075, pp. 76-85, University of Washington, Sealttle, WA.

Lengwehasatit, Krisda et al., "Computationally Scalable Partial Distance Based Fast Search Motion Estimation," Packet Video Corp., San Diego, California.

Takahashi, Kuniaki, et al., "Motion Vector Synthesis Algorithm for MPEG2-to-MPEG4 Transcoder," Proceedings of the SPIE, Bellingham, VA, vol. 4310, Sony Corporation, XP008000078, pp. 387-882, 2001 SPIE.

Soares, Luis Ducla, et al., "Influence of Encoder Parameters on the Decoded Video Quality for MPEG-4 Over W-CDMA Mobile Networks," NTT DeCoMo, Inc.

Aggarwal, Manoj et al., "Efficient Huffman Decoding," 2000 IEEE, 0-7803-6297-7, pp. 936-939, University of Illinois at Urbana-Champaign, Urbana, IL.

Sherwood, P. Greg et al., "Efficient Image and Channel Coding for Wireless Packet Networks," University of California, La Jolla, California.

Assuncao, Pedro et al., "Rate Reduction Techniques for MPEG-2 Video Bit Streams," SPIE, vol. 2952, Apr. 1996, pp. 450-459, University of Essex, Colchester, England.

Yin, Peng et al., "Video Transcoding by Reducing Spatial Resolution," Princeton University, 2000, Princeton, New Jersey.

Shanableh, Tamer et al., "Heterogeneous Video Transcoding to Lower Spatio-Temporal Resolutions and Difference Encoding Formats," IEEE Transactions on Multimedia, vol. 2, No. 2, Jun. 2000, pp. 101-110, Engineering and Physical Sciences Researc Counsel, Colchester, U.K.

Wiegand, Thomas et al., "Long-Term Memory Motion-Compensated Prediction for Rubust Video Transmittion," in Proc. ICIP 2000, University of Erlangen-Buremberg, Erlangen, Germany.

Fan, Zhigang et al. "Maximum Likelihood Estimation of JPEG Quantization Table in the Identification of Bitmap Compression History," Xerox Corporation, Webster, New York.

Thomas, Shine M. et al., "An Efficient Implentation of MPEG-2 (BC1) Layer 1 & Layer 2 Stereo Encoder on Pentium-III Platform", pp. 1-10, Sasken Communication Technologies Limited, Bangalore, India.

Ramanujan, Ranga S. et al., "Adaptive Streaming of MPEG Video Over IP Networks," 22nd IEEE Conference on Local Computer Networks (LCN '97), Nov. 02-05, 1997, 1997 IEEE, pp. 398-409, Architecture Technology Corporation, Minneapolis, MN.

Rejaie, Reza et al., "Architectural Considerations for Playback of Quality Adaptive Video Over the Internet," XP002177090, 2000 IEEE pp. 204-209, AT&T Labs, Menlo Park, California.

Bouras, C. et al., "On-Demand Hypermedia/Multimedia Service Over Broadband Networks," XP-002180545, 1996 IEEE Proceedings of HPDC-5 '96, pp. 224-230, University of Patras, Patras, Greece.

Chalidabhongse, Junavit et al., "Fast Motion Vector Estimation Using Multiresolution-Spatio-Temporal Correlations," IEEE Transactions On Circuits and Systems For Video Technology, vol. 7, No. 3, Jun. 1997, pp. 477-488.

Oh, Hwang-Seok et al., "Block-Matching Algorithm Based On An Adaptive Reduction of the Search Area For Motion Estimation," Real-Time Imaging, Academic Press Ltd., vol. 56, No. 5, Oct. 2000, pp. 407-414, XP004419498 ISSN: 1077-2014, Taejon, Korea.

Lee, Liang-Wei et al., "Dynamic Search-Window Adjustment and Interlaced Search for Block-Matching Algorithm," IEEE Transactions On Circuits and Systems for Video Technology, IEEE, vol. 3, No. 1, Feb. 3, 1993, pp. 85-87, XP000334581 ISSN: 1051-8215, New York.

Fukunaga, Shigeru et al., "MPEG-4 Video Verification Model Version 16.0" International Organization for Standardization: Coding of Moving Pictures and Audio, vol. N3312, Mar. 2000, pp. 1-380, XP000861688.

Kroner, Sabine et al., "Edge Preserving Noise Smoothing With An Optimized Cubic Filter," DEEI, University of Trieste, Trieste, Italy.

Kim, Jaemin et al., "Spatiotemporal Adaptive 3-D Kalman Filter for Video," pp. 1-12, Samsung Semiconductor, Inc. San Jose, California.

Liu, Julia J., "ECE497KJ Course Project: Applications of Wiener Filtering In Image and Video De-Noising," pp. 1-15, May 21, 1997.

Jostschulte, K. et al., "A Subband Based Spatio-Temporal Noise Reduction Technique for Interlaced Video Signals," University Dortmund, Dortmund, Germany.

Kossentini, Faouzi et al. "Predictive RD Optimized Motion Estimation for Very Low Bit-Rate Video Coding," 1997 IEEE, XP-000726013, pp. 1752-1963, Sep. 1, 1996, 1997 International Conference on Image Processing, Vancouver, Canada.

Tourapis, Alexis et al. "New Results on Zonal Based Motion Estimation Algorithms—Advanced Predictive Diamond Zonal Search," 2001 IEEE, pp. V 183-V 186, The Hong Kong University of Science and Technology, Clear Water Bay, Kowloon, Hong Kong.

Brandenburg, Karlheinz, "MP3 and AAC Explained," Proceedings of AES 17th International Conference, XP008004053, pp. 99-110, Erlangen, Germany.

Painter, Ted et al., "Perceptual Coding of Digital Audio," Proceedings of the IEEE, vol. 88, No. 4, Apr. 2000, pp. 451-513, XP001143231, ISSN: 0018-9219, Arizona State University, Tempe. AZ.

Hassanzadegan, Hooman et al., "A New Method for Clock Recovery in MPEG Decoders," pp. 1-8, Basamad Negar Company, Tehran, Iran.

Kan, Kou-Sou et al., "Low-Complexity and Low-Delay Video Transcoding for Compressed MPEG-2 Bitstream," Natinal Central University, Chung-Li, Taiwan.

Mitchell et al., "MPEG Video Compression Standard: 15.2 Encorder and Decorder Buffering," Chapman and Hall Digital Multmedia Standards Series, pp. 340-356, XP002115299, ISBN: 0-412-08771-5, Chapman and Hall, New York.

Whybray, M.W. et al., "Video Coding—Techniques, Standards and Applications," BT Technol J. vol. 14, No. 4, Oct. 4, 1997, pp. 86-100, XP000722036.

"SHARP Product Information: VTST-Series NTSC/PAL Electronic Television Tuners," RF Components Group, Sharp Microelectronics of the America, 1997.

Edwards, Larry M., "Satisfying Your Need for Net Speed," San Diego Metropolitan, Sep. 1999, <<www.sandiegometro.com/1999/sept/speed.html>>, retrieved on Jul. 19, 2001.

Oz, Ran et al., "Unified Headend Technical Management of Digital Services," BigBend Networks, Inc.

Muriel, Chris, "What is Digital Satellite Television?," What is Digital Television Rev. 3.0 Apr. 21, 1999, SatCure, Sandbach, England, <<http://www.netcentral.co.uk/satcure/digifaq.htm>>, access on Apr. 20, 2001.

"CONEXANT Products & Tech Info: Product Briefs: CX24108," 2000-2002 Conexant Systems, Inc. access on Apr. 20, 2001.

"CONEXANT Products & Tech Info: Product Briefs: CX22702," 2000-2002 Conexant Systems, Inc. access on Apr. 20, 2001.

"TDC: Components for Modems & Digital Infotainment: Direct Broadcast Satellite Chipset," 2001 Telecom Design Communications Ltd., U.K., <<http://www.tdc.co.uk/modmulti/settop/index.htm>>, access on Apr. 20, 2001.

"White Paper: Super G: Maximizing Wireless Performance," Mar. 2004, Atheros Communications, Inc., pp. 1-20, Document No. 991-00006-001, Sunnyvale, California.

Kwok, Y.K. et al., "Efficient Multiple Access Control Using a Channel-Adaptive Protocol for a Wireless ATM-Based Multimedia Services Network," Mar. 29, 2000, Computer Communications 24(2001) 970-983, University of Hong Kong, Hong Kong, PRC.

Liang, Ying-Chang et al., "Joint Downlink Beamforming, Power Control, and Data Rate Allocation for DS-CDMA Mobile Radio with Multimedia Services," 2000 IEEE, pp. 1455-1457, Ceneter for Wireless Communication, Singapore.

Razavi, Behzad, "Challenges in Portable RF Transceiver Design," Sep. 1996, 1996 IEEE, pp. 12-25, Circuits & Devices.

Mannion, Patrick, "IceFyre Device Cools 802.11a Power Consumption," Sep. 24, 2001, Planet Analog, National Semiconductor, <<http://www.planetanalog.com/OEG20010924S0079>>, access on Nov. 5, 2001.

"ICE Fyre Semiconductor; IceFyre 5-GHz OFDM Modem Solution," Sep. 2001, pp. 1-6, ICEFYRE: Rethink Wireless, IceFyre Semiconductor, Inc.

Pozar, David M., "Theory and Design of Ferrimagnetic Components," 1990, pp. 529, Microwave Engineering, Addison-Wesley Publishing Company, Inc.

"Part 11: Wireless LAN Medium Access Control (MAC) and Physical Layer (PHY) Specifications: High-Speed Physical Layer in the 5 GHz Band," 1999 IEEE, pp. 1-83, Supplement to IEEE Standard fo rInformation Technology, IEEE Std 802.11a-1999, LAN/MAN Standards Committee.

Ciciora, Walter S., "Cable Television in the United States: An Overview," May 25, 1995, pp. 1-90, Cable Television Laboratories, Inc., Louisville, Colorado.

* cited by examiner

SYSTEM FOR SIGNAL MIXING AND METHOD THEREOF

FIELD OF THE DISCLOSURE

The present disclosure relates generally to signal mixing and more specifically to modifying sinusoidal representation for signal mixing.

BACKGROUND

Digital signal mixing combines two separate digital signals into a single mixed signal having characteristics of both of the separate digital signals. Such mixing techniques are generally known in communications applications. Generally, signal mixing is used in heterodyning. In heterodyning, an input signal having a center frequency and a particular baseband spectrum, is mixed with a locally generated signal to generate a mixed signal. The mixed signal represents the input signal, keeping the same baseband spectrum as the input signal; however, with a different center frequency from the input signal. Shifting the center frequency of a signal allows for specific filtering or sample-rate matching.

A method of digital signal mixing is direct mixing, in which sampled values of an input signal are mixed with values from a sinusoid of a particular frequency. A processor may be used to combine sets of sampled values from the input signal and the sinusoid to generate the mixed signal. The processor performs several calculations to generate each value of the mixed signal. A first set of calculations is performed to generate or obtain values of the sinusoid. A second set of calculations is performed to combine values of the input signal with values of the sinusoid. The calculations may be difficult to implement during real-time signal processing.

The time available to perform signal mixing calculations is limited by the highest rate of the input signal accepted. To be performed real-time, signal-mixing calculations must generally be performed at speeds faster than the rate used to receive values of the input signal. If the calculations take too long to perform, data values from the input signal may be lost. Current methods of digital signal mixing are too processor intensive.

Methods of reducing processor overhead in calculating mixed signals have been attempted. To reduce calculations performed during the generation of the sinusoid, values of a pre-generated sinusoid are stored in a lookup table, eliminating a need to calculate the sinusoid as part of real-time mixing calculations. However, pre-calculating the sinusoid only offers limited success, because the processor must still perform the mixing calculations between the input signal values and the lookup table sinusoid values in real time.

Another limitation of conventional methods of mixing digital signals is that some of the values associated with the sinusoid are floating point values, which further increase computational complexity during mixing operations. To reduce calculation complexity, conventional methods sometimes represent the sinusoid using the values 1, 0, −1, and 0. Mixing operations using the values of 1, 0, −1, and 0 simplify mixing calculations; however the values are not always appropriate because the mixing frequency that is convenient from using the values of 1, 0, −1, and 0 may not be the correct frequency in the desired application. Using the sequence of values of 1, 0, −1, and 0 generates a sinusoid at one quarter of sampling rate used. The forced relationship of one quarter a sampling rate may not be practical as the sampling rate could be fixed due to analog circuit constraints; while, the mixing frequency could be fixed due to external standards bodies. From the above discussion, it should be clear that a less processor intensive method of mixing digital signals is needed.

BRIEF DESCRIPTION OF THE DRAWINGS

Specific embodiments of the present disclosure are shown and described in the drawings presented herein. Various objects, advantages, features and characteristics of the present disclosure, as well as methods, operations and functions of related elements of structure, and the combination of parts and economies of manufacture, will become apparent upon consideration of the following description and claims with reference to the accompanying drawings, all of which form apart of this specification, and wherein:

DETAILED DESCRIPTION OF THE FIGURES

FIGS. 1–4 disclose a method and system of shifting the center frequency of an input signal by mixing the input signal with a sinusoidal waveform. The method includes receiving data values representing the input signal waveform at particular points in time. The method also includes representing sampled values of the sinusoidal waveform as a plurality of bit-shift summation sets, with the bit-shift summation sets representing the sinusoidal waveform at particular points in time. The plurality of bit-shift summation sets include bit shifts and additions to be applied to the input signal waveform, in effect mixing the sampled values of the sinusoidal waveform and the input signal waveform. To simplify the generation of the bit-shift summation sets, the sinusoidal waveform is normalized to a value greater than one. For example, in one embodiment, the sinusoidal waveform is normalized to a value of $^{17}/_{16}$.

Figure 1:
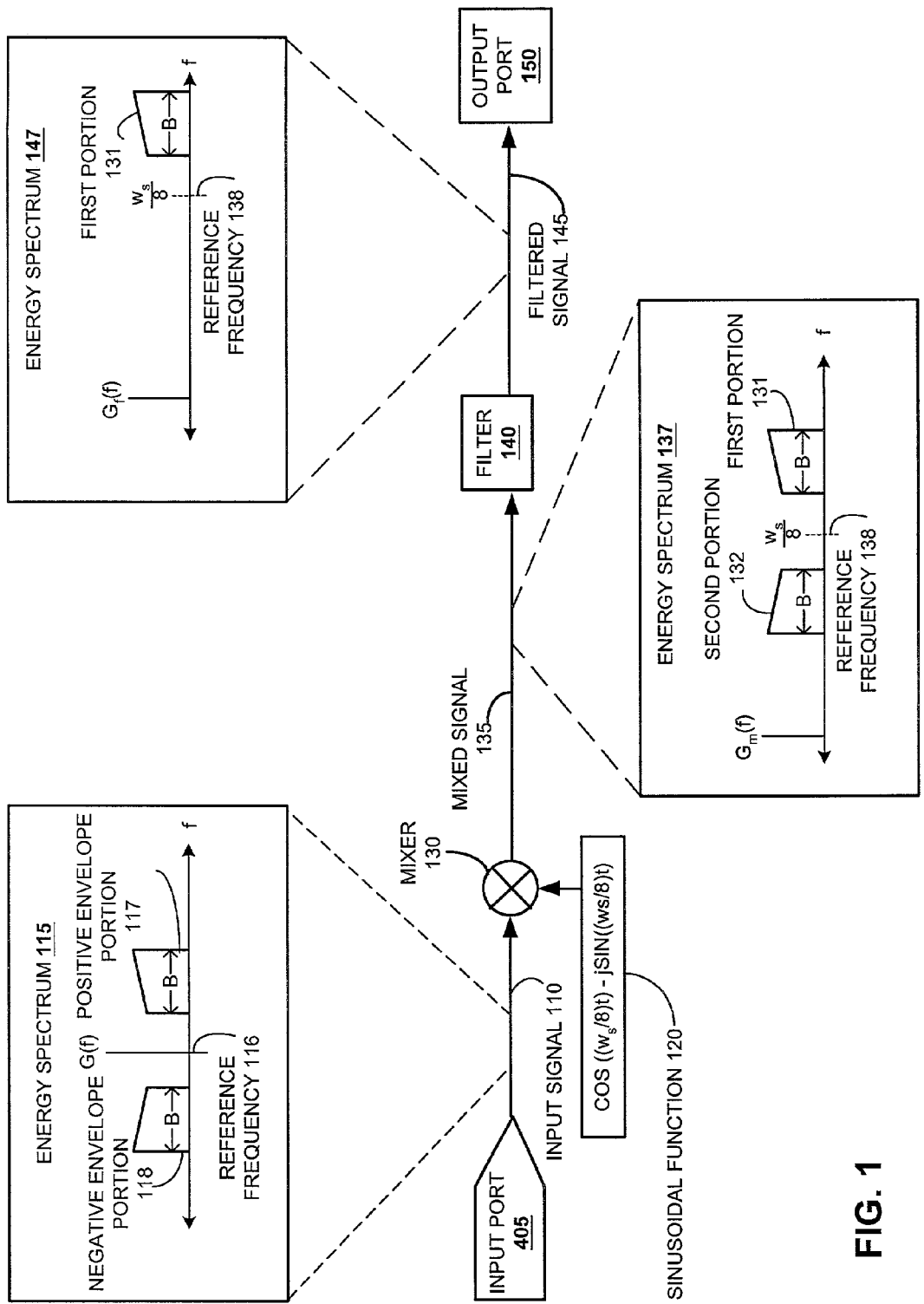
FIG. 1 is a block diagram illustrating a system for displacing a bandpass signal in frequency, according to one embodiment of the present disclosure.

Referring now to FIG. 1, a block diagram illustrating a system for shifting an input signal in frequency is shown, according to one embodiment of the present disclosure. An input signal waveform, input signal 110, is received through input port 405 and mixed with a sinusoidal function 120 to generate a mixed signal 135. The mixed signal 135 represents the input signal 110 shifted in frequency. The mixed signal 135 is filtered to generate a filtered signal 145, which is provided through output port 150. The sinusoidal function 120 is represented by a set of bit-shift summation values as will be discussed further in reference to FIG. 2.

In the illustrated embodiment, input signal 110 represents a bandpass signal with an energy spectrum 115, as defined by a function G(f). Energy spectrum 115 describes the energy of the bandpass signal at particular frequencies. Input signal 110 is a real valued signal, so energy spectrum 115 includes a positive envelope portion 117 (indicating a response at positive frequencies) and negative envelope portion 118 (indicating response to negative frequencies) symmetric to positive envelope portion 117. It should be noted that while a signal with only real components is discussed, the present disclosure may be applied to complex signals.

Both positive envelope portion 117 and negative envelope portion 118 may be defined as having a bandwidth of B hertz. For purposes of discussion, we will designate a reference frequency exactly between the positive envelope portion 117 and the negative envelope portion 118. In energy spectrum 115, the reference frequency 116 lies at the zero frequency point.

In one embodiment, it is desirable to shift the input signal 110 to a higher frequency. The shift in frequency may be to accommodate a new sampling rate, to accommodate transmission in a different frequency band, or some other purpose. To shift input signal 110 in frequency, a mixer 130 is provided. Mixer 130 applies a sinusoidal function 120 to input signal 110. By mixing input signal 110 with sinusoidal function 120, input signal 110 may be shifted in frequency by an amount approximately equal to the frequency of the sinusoidal function 120. In one embodiment, the sinusoidal waveform used for mixing is defined using an amplitude, "A", a frequency, "ω", a time, "t", the constant for the base of the natural logarithm, "e", and the imaginary component term, "j", such as in the sinusoid equation:

$$Ae^{-j\omega t}.$$

The above sinusoid equation is mathematically equivalent to:

$$Ae^{-j\omega t}=A[\cos(\omega t)-j\,\sin(\omega t)].$$

The sinusoid equation "COS(ωt)–j SIN(ωt)" represents a sinusoid having a period of "ωt" and an amplitude of "A". "COS(ωt)" represents a real component of the sinusoidal waveform, while the imaginary component term, "j" (equivalent to the square root of negative one), identifies the "SIN(ωt)" as being part of an imaginary component of the sinusoidal waveform. Time may be used to identify particular data points on both input signal 110 and sinusoidal function 120. Accordingly, the same value of "t" will indicate a particular data point and a corresponding point in sinusoidal function 120.

In one embodiment, it is desired to use eight sampled values per period of the sinusoidal function used for mixing, such as sinusoidal function 120. The frequency, "ω", may be defined as "$\omega_s/8$" indicating a sampling frequency, "ω" needed to allow eight values of the sinusoidal function 120 to be sampled, at a frequency of "$\omega_s$", for every period of the sinusoidal function 120. Accordingly, the sinusoidal function 120 may be defined according to the following function.

$$A[\cos(\frac{\omega_s}{8}t)-j\sin(\frac{\omega_s}{8}t)].$$

As mixer 130 mixes input signal 110 with sinusoidal Function 120, a mixed signal 135 is generated. Mixed signal 135 is a representation of input signal 110 shifted in frequency. Mixed signal 135 includes an energy spectrum 137, as defined by a function $G_m(f)$. Energy spectrum 137 includes a first portion 131, having a bandwidth of B hertz, related to positive envelope signal 117 and a second portion 132 related to negative envelope portion 118. The reference frequency, marking a frequency exactly between first portion 131 and second portion 132, may be found in energy spectrum 137 as reference frequency 138, at a frequency of $\omega_s/8$, indicating input signal 110 has been shifted in frequency by $\omega_s/8$ as dictated by sinusoidal function 120.

In one embodiment, the resultant second portion 132 is undesired for transmission as second portion 132 may interfere with other signals to be transmitted. Accordingly, a filter 140 may be used to remove second portion 132. Filter 140 may include a bandpass filter used to severely attenuate signals within the frequencies represented by second portion 132. Filter 140, when used, generates a filtered signal 145 from mixed signal 135. An energy spectrum 147, as defined by a function $G_f(f)$, still includes first portion 131; however, second portion 132 has been removed by filter 140. The filtered signal 145 may then be output through output port 150. The filtered signal 145 may then be provided to other components of a communications system (not shown). It should be noted that while input signal 110 represents a particular bandpass signal, other forms of signals may be mixed using the methods described herein. Furthermore, while input signal 110 is described to as a signal with only real components, complex signals may also be applied without departing from the scope of the present disclosure. Furthermore, while sinusoidal function 120 is shown as having real and imaginary portions, sinusoidal function 120 could be real only or imaginary only without departing from the scope of the present disclosure.

To simplify calculations needed to perform a mixing of sinusoidal function 120 with input signal 110, the amplitudes of samples of sinusoidal function 120 are represented using bit-shift summation sets. The values of sinusoidal function 120 are normalized to a value greater than one, sampled and converted into values that may be represented during mixing by accumulating one or more bit-shifts of the in input signal 110 values, as discussed further in reference to FIG. 2. For example, real values of sinusoidal function 120 may be normalized between $17/16$ and $-17/16$. A sample of sinusoidal function 120 may include a maximum value of $17/16$, also represented as "$1+1/16$". Since a division of a value by sixteen may be generated using four binary shifts of the value to the right, a value of the input signal may be mixed with a value of "$1+1/16$" by adding the input signal value with a value of itself binary shifted four times to the right.

Figure 2:
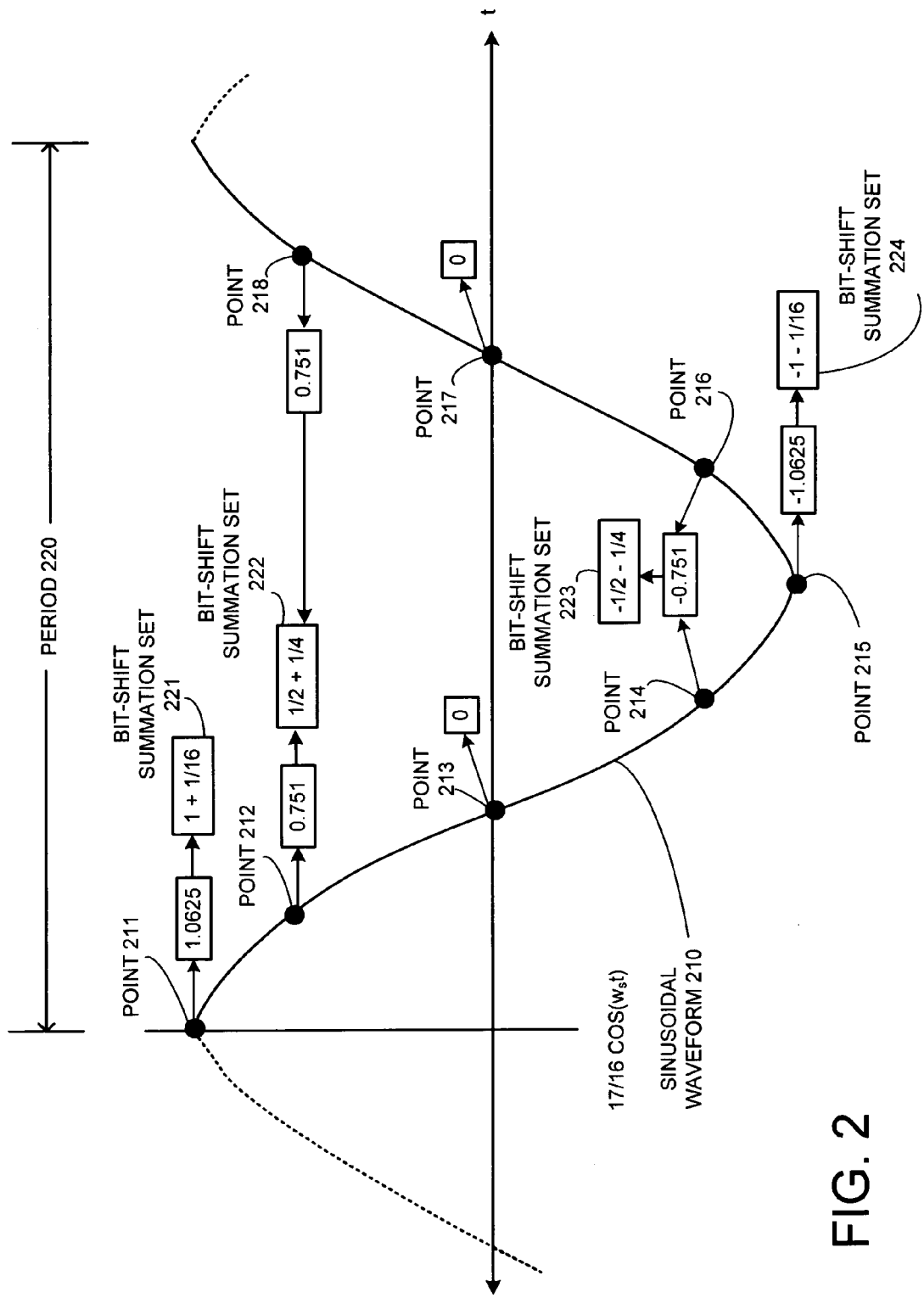
FIG. 2 is a diagram identifying points on a sinusoidal function represented by bit-shift summation sets, according to one embodiment of the present disclosure.

Referring now to FIG. 2, a diagram identifying points on a sinusoidal function represented by bit-shift summation sets is shown, according to one embodiment of the present disclosure. A sinusoidal waveform 210, normalized at a value greater than one, is sampled at particular points, such as points 211–218, along a period 220 of the sinusoidal waveform 210 to generate sampled values. The sampled values are then represented using values that may be realized using binary shifting and addition, such as defined by bit-shift summation sets 221–224.

In the illustrated embodiment, a real part of a mixing function, such as sinusoidal function 120 (FIG. 1) is represented using sinusoidal waveform 210. Sinusoidal waveform 210 is normalized at a value of $17/16$ and is represented using the function:

$$\frac{17}{16}\cos(\frac{\omega_s}{8}t),$$

where the amplitude of sinusoidal waveform 210 is $17/16$ and the frequency of sinusoidal waveform 210 is $\omega_s/8$.

Accordingly, a sampler defined at a rate of "$\omega_s$" would receive eight points of sinusoidal waveform 210 for a full period, such as period 220. The points, such as points 211–218, may be sampled substantially equidistant from each other in time. In the illustrated embodiment, points 211–218 are sampled from sinusoidal waveform 219 for mixing operations. In other systems, the values of points 211–218 would be multiplied with values of an input signal, such as input signal 110 (FIG. 1). Since the values include decimal values or fractions, the calculations to perform multiplications during mixing may get complex and generate intense processing overhead to calculate a mixed signal. To simplify mixing calculations, the values of points 211–218 may be represented using bit-shift summation sets 221–224.

For example, point 211 corresponds to a value of $17/16$, equivalent to 1.0625. However, $17/16$ is equivalent to one plus $1/16$. Using binary operations, a division of a value by sixteen may be represented as four binary shifts of the value to the right. Therefore, point 211 may be represented by bit-shift summation set 221. A mixed value of point 211 with an input signal value should represent a multiplication of "one plus $1/16$" by the input signal value, equivalent to the input signal value plus the input signal value divided by 16, according to the associative law of mathematics. Accordingly, bit-shift summation set 221 indicates that a mixing of an input value with point 211 may be performed by adding the input signal value with the input signal value binary shifted four places to the right. Similarly, a point 215 is identified by the value $-17/16$. A related bit-shift summation set 224 may be performed similar to bit-shift summation set 221, with a negation on the generated result. It should be noted that if a two's compliment form of negation is being used, the mixed value may need to be converted to a two's compliment negative value.

Point 211 represents a maximum value of sinusoidal waveform 210. In one embodiment, the maximum value of sinusoidal waveform, point 211, is not only chosen to allow point 211 to be represented using bit-shift summation sets, such as bit-shift summation set 221, but to also allow a midpoint, such as point 212 (midway between point 211 representing a maximum value and point 213 representing a minimum value), to be represented using bit-shift summation sets, such as bit-shift summation set 222. Point 212 corresponds to a value of 0.751 on sinusoidal waveform 210. The value of point 212 may be approximated using a value of 0.75. The value of 0.75 may be represented as ½ plus ¼. It should be noted that a value may be divided by two using a single binary shift to the right. Furthermore, a value may be divided by four using two binary shifts to the right. Accordingly, a bit-shift summation set 222 may be generated for point 212 indicating a single binary shift of the input value to the right added with a double binary shift of the input value to the right. Point 214 corresponds to a value of −0.751. Point 214 is simply a negative value of point 212; accordingly, a bit-shift summation set 223, corresponding to point 214, may be defined using bit-shift summation set 222, with a negation on the resultant mixed value. Point 218 corresponds to the same value as point 212; accordingly, bit-shift summation set 222 may be used for point 218. As point 216 corresponds to the same value as point 214, bit-shift summation set 223 may also be used to represent a mixing of point 216. It should be noted that in the discussed embodiment, the only error present is in the use of bit-shift summation sets 222 and 223 used for points 212, 214, 216 and 218, wherein the error for representing 0.751 with 0.75 is within 1.4 thousandths.

Points 213 and 217 correspond to a value of zero. As a real value multiplied by zero is still zero, a mixing of an input value with point 213 or point 217 will result in zero. While sinusoidal waveform 210 has been described for generating a real component of a mixed waveform using a sinusoidal function, such as sinusoidal function 120 (FIG. 1), similar bit-shift summation techniques may be performed to calculate an imaginary portion for complex signal mixing. Accordingly, bit-shift summation sets 211–214 may be used to represent sampled values of a sine function, as defined in the imaginary portion of the complex function defined by sinusoidal function 120, without departing from the scope of the present disclosure.

It may be desired that bit-shift summation sets 221–224 represent associated points 211–218 within a particular level of accuracy. In one embodiment, bit-shift summation sets 221–224 can be used to represent associated points 211–218 within 45 dB. For example, bit-shift summation set 222 is equivalent to a value of 0.75 whereas a represented point 212 is equivalent to a value of 0.751. Accordingly, bit-shift summation set 222 can be used to represent point 212 within accuracy of 57 dB. Furthermore, note that all values can be shifted a functionally equivalent number of places to the left or to the right without changing the accuracy of relative points. It should be noted that such shifting is equivalent to scaling the sinusoid by a factor of two. For example, point 211 may be represented by a bit-shift summation set of ½+$1/32$ and point 212 may be represented by a bit-shift summation set of ¼+⅛. Such shifting, or scaling, may be performed without departing from the scope of the present disclosure.

Figure 3:
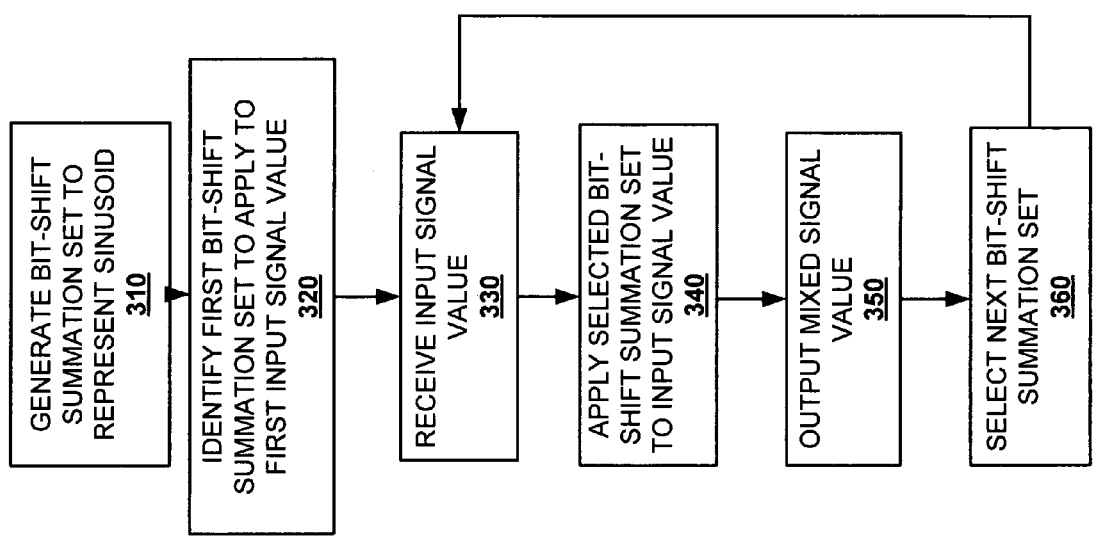
FIG. 3 is a flow diagram illustrating an improved method of mixing a sinusoidal waveform with values of an input signal, according to one embodiment of the present disclosure.

Referring now to FIG. 3, a flow diagram illustrating an improved method of mixing a sinusoidal waveform with values of an input signal is shown, according to one embodiment of the present disclosure. Bit-shift summation sets are generated to represent portions of a sinusoidal waveform. The bit-shift summation sets are then applied to input signal values to generate mixed waveform values.

In step 310, the bit-shift summation sets are generated to represent sinusoid values. As previously discussed in reference to FIG. 2, a sinusoidal waveform, normalized at a value greater than one, is sampled to generate a set of sampled values for mixing with input signal values. The sinusoid waveform represents a portion of a function to be mixed with an input signal. The bit-shift summation sets indicate a number of binary shifts to be performed on the input signal values to generate mixed signal values. In step 320, a first bit-shift summation set is identified for application with the first received input signal value. The first bit-shift summation set is selected from the whole set of bit-shift summation sets to be applied to the first sampled value of the sinusoidal waveform.

In step 330, the first input signal value is received. The input signal value is a single value associated with a plurality of values that represent the input signal. In step 340, the selected bit-sift summation set is applied to the received input signal value. As discussed in reference to FIG. 2, the selected bit-shift summation set may be applied to the received input signal value by performing a series of binary shifts on the received input signal value and adding the results of the binary shifts. In step 350, the resultant value of the bit-shift summation set applied to the received input signal value is output as a mixed signal value. In step 360, a bit-shift summation set is selected to represent a next sampled point on the sinusoidal waveform. The process may return to step 330 to receive a next input signal value to be mixed with the newly selected bit-shift summation set.

Figure 4:
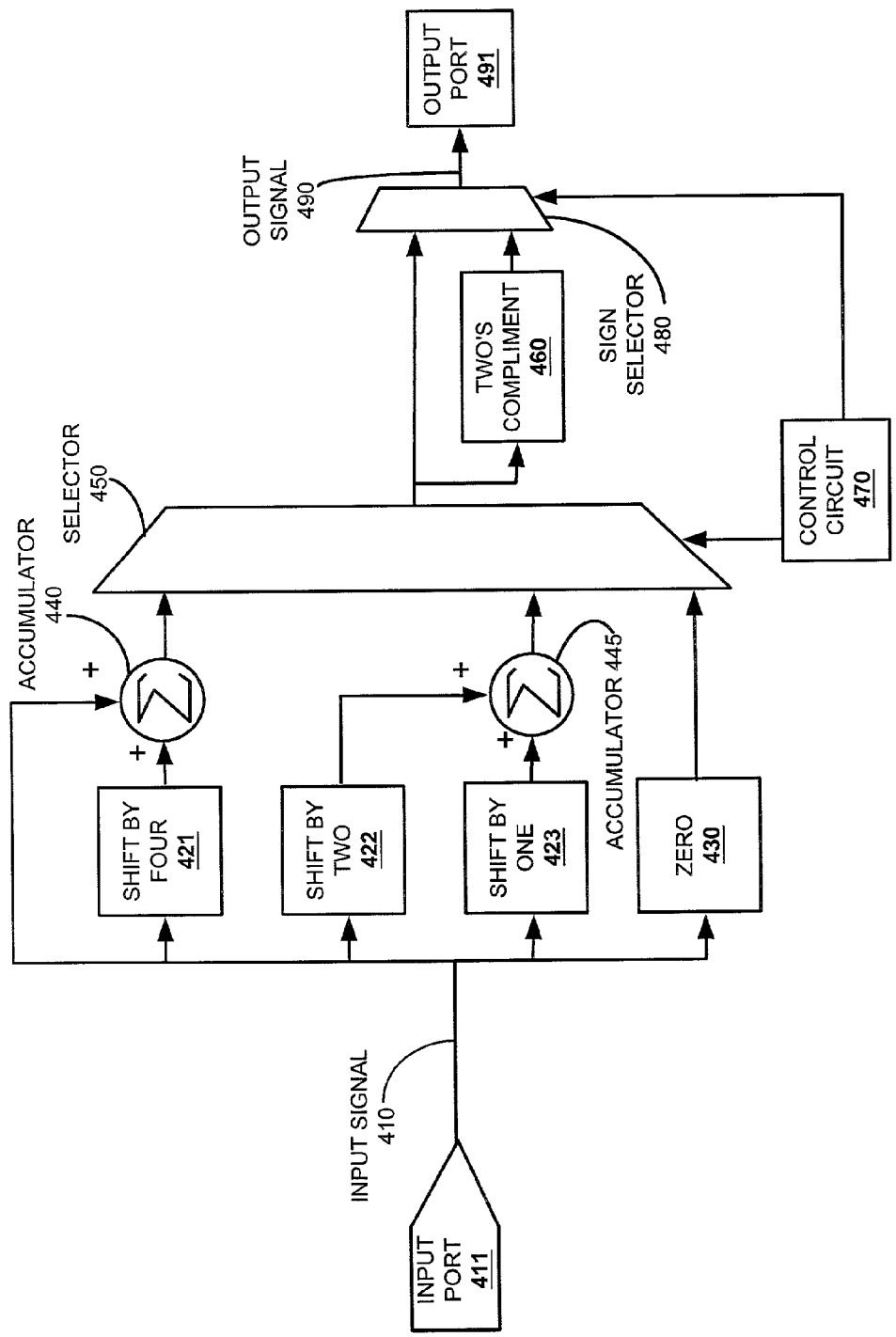
FIG. 4 is a block diagram illustrating a system for mixing points of a sinusoidal function with data values from an input signal, according to one embodiment of the present disclosure.

Referring now to FIG. 4, a block diagram illustrating a system for mixing points of a sinusoidal function with data values from an input signal is shown, according to one embodiment of the present disclosure. An input signal 410 is read through an input port 411. The input signal 410 is to be mixed with a sinusoidal waveform. Values from the sinusoidal waveform are represented using bit-shift summation sets. Binary shifters 421–423 are used to provide shifting associated with the bit-shift summation sets. The binary shifters 421–423 may be used to generate values to be output through output port 491 as part of a mixed signal, such as output signal 490.

Binary shifters 421–423 represent divisions to be performed on values from input signal 410, in support of mixing operations. For example, a shift-by-four binary shifter 421 may be used to divide a particular value received from input signal 410 by sixteen. An accumulator 440 adds a value received from input signal 410 with the output form shift-by-four binary shifter 421. Accordingly, the accumulator 440 may perform a mix of a received input value by "1+1/16", representing a mixing of the input value with a point on the sinusoidal waveform, such as point 211 (FIG. 2).

Shift-by-two binary shifter 422 performs a double binary shift on an input signal value. Accordingly, shift-by-two binary shifter 422 may perform a division of the input signal value by four. Shift-by-one binary shifter 423 performs a single binary shift on an input signal value to represent a division of the input signal value by two. Accumulator 445 performs an addition of the outputs of shifters 422 and 423. Accordingly, accumulator 445 represents a mixing of an input signal value with (½+¼), such as to perform a mixing with point 212 (FIG. 2) of the sinusoidal waveform. A zero value 430 may be provided to provide a zero in place of a mixing between an input value and any points corresponding to a value of zero on the sinusoidal waveform.

A selector 450 may be provided to select among accumulators 440 or 445, or zero value 430, dependent on a point on the sinusoidal waveform to be represented in the mixing operations. A control circuit 470 may be used to track the point on the waveform to be represented in the mixing operations. Control circuit 470 may include bit-shift summation sets to dictate which accumulator 440 or 445 or zero value 430 to select. For example, a counter (not shown) may be used to track a point or bit-shift summation set to use. A sign selector 480 may be used to select between the value chosen through selector 450 and a negative version of the value generated through two's compliment module 460. As some of the points on the waveform represent negative values, such as points 214–216 (FIG. 2), the binary shied and accumulated values may need to be negated before being output. Accordingly, control circuit 470 may track the portion of the sinusoidal waveform being used in mixing operations and select either the value output by selector 450 or a negated value output by two's compliment module 460. The value selected by sign selector 490 may then be output through output port 491 as part of an output signal 490.

In one embodiment, the selectors 450 and 480 include hardware multiplexers. It should be noted that the components described herein may be part of hardware within a communications system or programmed as part of a firmware without departing from the scope of the present disclosure. The components described herein may also form part of mixing operations being performed within a monolithic semiconductor device. The mixing operations described may be performed as part of in-phase (I) and quadrature (Q) signal component mixing operations. It should be noted that waveforms defined by other substantially sinusoidal functions may also be used for mixing operations without departing from the scope of the disclosure.

The systems described herein may be part of an information handling system. The term "information handling system" refers to any system that is capable of processing information or transferring information from one source to another. An information handling system may be a single device, such as a computer, a personal digital assistant (PDA), a hand held computing device, a cable set-top box, an Internet capable device, such as a cellular phone, and the like. Alternatively, an information handling system may refer to a collection of such devices. It should be appreciated that the system described herein has the advantage of simplifying mixing operations performed within a communications system.

In the preceding detailed description of the embodiments, reference has been made to the accompanying drawings which form a part thereof, and in which is shown by way of illustration specific embodiments in which the disclosure may be practiced. These embodiments are described in sufficient detail to enable those skilled in the art to practice the disclosure, and it is to be understood that other embodiments may be utilized and that logical, mechanical and electrical changes may be made without departing from the spirit or scope of the disclosure. To avoid detail not necessary to enable those skilled in the art to practice the disclosure, the description may omit certain information known to those skilled in the art. Furthermore, many other varied embodiments that incorporate the teachings of the disclosure may be easily constructed by those skilled in the art. Accordingly, the present disclosure is not intended to be limited to the specific form set forth herein, but on the contrary, it is intended to cover such alternatives, modifications, and equivalents, as can be reasonably included within the spirit and scope of the disclosure. The preceding detailed description is, therefore, not to be taken in a limiting sense, and the scope of the present disclosure is defined only by the appended claims.

What is claimed is:

1. A method comprising:
    receiving data values associated with a signal waveform, wherein the data values represent the signal waveform at particular points in time;
    representing sampled values of a sinusoidal waveform, normalized at a value other than one, as a plurality of bit-shift summation sets, wherein the sampled values represent the sinusoidal waveform at particular points in time; and
    applying a particular bit shift summation set of the plurality of bit-shift accumulation sets to a particular data value of the data values associated with the signal waveform, wherein the particular bit-shift summation set and the particular data value correspond to a similar point in time.

2. The method as in claim 1, wherein the plurality of bit-shift summation sets represent the sinusoidal waveform using eight sets of data values within a period of the sinusoidal waveform.

3. The method as in claim 2, wherein the values include 17/16, 3/4, 0, −3/4, and −17/16.

4. The method as in claim 1, wherein the method is performed as part of operations within a monolithic semiconductor device.

5. The method as in claim 4, wherein the method is performed as part of in-phase mixing operations within the monolithic semiconductor device.

6. The method as in claim 4, wherein the method is performed as part of quadrature mixing operations within the monolithic semiconductor device.

7. The method as in claim 1, wherein a peak associated with the sinusoidal waveform is calculated using only one addition operation.

8. A method comprising:
   identifying a set of points to represent a sinusoidal waveform, wherein the set of points include a maximum point and a zero point;
   identifying a value, other than one, associated with the maximum point based on a midpoint, wherein the midpoint is a point of the set of points between the maximum point and the zero point; and
   applying said value associated with the maximum point to an input data value using bit-shift summation.

9. The method as in claim 8, wherein the value associated with the maximum point is selected to allow bit-shift summation to be performed in place of values associated with points of the set of point; wherein the bit-shift summation is used to represent the values associated with points of the sets of points within a level of accuracy.

10. The method as in claim 9, wherein an accuracy of bit-shit summation values compared to the values associated with points of the sets of points is greater than 45 decibels.

11. The method as in claim 8, wherein no more than two operands are used to represent a particular value associated with the points of the set of points.

12. The method as in claim 8, wherein the set of points include eight points for every period of the sinusoidal waveform.

13. The method as in claim 12, wherein adjacent points of the set of points are substantially equidistant.

14. The method as in claim 8, wherein a value of the maximum point is $17/16$.

15. The method as in claim 8, further including applying the set of points to an array of data associated with a received signal waveform to generate an output waveform.

16. A system comprising:
   an input port to receive input data values associated with an input signal waveform;
   a bit-shift summation set including values associated with a sinusoidal waveform normalized at a value other than one;
   a mixer to apply values from a bit-shift summation set to the input data values to generate a portion of a mixed signal waveform; and
   an output port to provide data values associated with said mixed signal waveform.

17. The system as in claim 16, wherein said values associated with a sinusoidal waveform include eight values for every period of said sinusoidal waveform.

18. The system as in claim 17, wherein said values include $17/16$, $3/4$, $0$, $-3/4$, and $-17/16$.

19. The system as in claim 16, wherein the value other than one includes $17/16$.

20. The system as in claim 16, wherein the system is part of a monolithic semiconductor device.

21. The system as in claim 20, wherein the system forms part of in-phase mixing portions within the monolithic semiconductor device.

22. The system as in claim 20, wherein the system forms part of quadrature mixing portions within the monolithic semiconductor device.

23. The system as in claim 16, wherein said mixer includes binary shifters for applying bit-shifts to said input data values.

* * * * *

UNITED STATES PATENT AND TRADEMARK OFFICE
CERTIFICATE OF CORRECTION

PATENT NO. : 7,139,330 B1  
APPLICATION NO. : 09/999540  
DATED : November 21, 2006  
INVENTOR(S) : Michael R. May Page 1 of 1

It is certified that error appears in the above-identified patent and that said Letters Patent is hereby corrected as shown below:

Column No. 9, Line No. 20, change "point;" to --points,--

Column No. 9, Line No. 24, change "bit-shit" to --bit-shift--

Signed and Sealed this

Eighth Day of July, 2008

JON W. DUDAS  
*Director of the United States Patent and Trademark Office*